United States Patent
Jang et al.

(10) Patent No.: US 6,797,629 B2
(45) Date of Patent: Sep. 28, 2004

(54) METHOD OF MANUFACTURING NANO TRANSISTORS

(75) Inventors: Moon Gyu Jang, Daejon-Shi (KR); Won Ju Cho, Daejon-Shi (KR); Seong Jae Lee, Daejon-Shi (KR); Kyoung Wan Park, Daejon-Shi (KR)

(73) Assignee: Electronics and Telecommunications Research Institute (KR)

( * ) Notice: Subject to any disclaimer, the term of this patent is extended or adjusted under 35 U.S.C. 154(b) by 273 days.

(21) Appl. No.: 10/185,104

(22) Filed: Jun. 27, 2002

(65) Prior Publication Data

US 2003/0134514 A1 Jul. 17, 2003

(30) Foreign Application Priority Data

Jan. 16, 2002 (KR) ................................. 10-2002-2497

(51) Int. Cl.[7] ............................................. H01L 21/302
(52) U.S. Cl. ................... 438/694; 438/700; 438/705; 438/706; 438/715
(58) Field of Search ................... 438/694, 700, 438/705, 706, 715

(56) References Cited

U.S. PATENT DOCUMENTS 6,165,876 A * 12/2000 Yamazaki et al. .......... 438/517
6,294,412 B1 * 9/2001 Krivokapic ................. 438/155
6,433,361 B1 * 8/2002 Zhang et al. ................ 257/59
6,534,832 B2 * 3/2003 Takemura ................... 257/350
6,730,557 B2 * 5/2004 Arai ........................... 438/234

FOREIGN PATENT DOCUMENTS

| KR | 1998-41375 | 5/2000 |
|---|---|---|
| KR | 1998-47366 | 6/2000 |

OTHER PUBLICATIONS

2000 IEEE, "New Channel Engineering for Sub–100 nm MOS Devices Considering Both Carrier Velocity Overshoot and Statistical Performance Fluctuations", T. Mizuno, 6 pages.*

* cited by examiner

Primary Examiner—Nadine G. Norton
Assistant Examiner—Binh X. Tran
(74) Attorney, Agent, or Firm—Blakely Sokoloff Taylor & Zafman

(57) ABSTRACT

The present invention relates to a method of manufacturing a nano transistor. The present invention manufactures the nano transistor without changing a conventional method of forming the nano transistor formed on a SOI substrate. Further, the present invention includes forming a N well and a P well at giving regions of an underlying silicon substrate so that a given voltage can be individually applied to a NMOS transistor and a PMOS transistor. Therefore, the present invention can control the threshold voltage to prevent an increase of the leakage current.

11 Claims, 3 Drawing Sheets

METHOD OF MANUFACTURING NANO TRANSISTORS

BACKGROUND OF THE INVENTION

1. Field of the Invention

The invention relates generally to a method of manufacturing a nano transistor using a SOI (silicon on insulator) substrate, and more particularly to, a method of manufacturing a nano transistor capable of controlling the threshold voltage and preventing increase of the leakage current, in such a way that a nanometers transistor formed is formed on the SOI substrate by a conventional method, and N-well and P-well are formed at given regions of an underlying silicon substrate so that a given voltage of the substrate can be individually applied to a NMOS transistor and a PMOS transistor.

2. Description of the Prior Art

As the length of a gate in a transistor is reduced to several run, there is a limit to controlling of the threshold voltage of the devices. In the case of silicon widely used as, for example, a semiconductor substrate, the lattice constant of silicon is about 5.4 Å (1 Å=$10^{-10}$ m). 5.4 Å corresponds 0.54 nm. In other words, if a gate having the length of 50 nm is used, the number of silicon atoms existing at a channel region formed below the gate is about 100. At this time, as the concentration of an impurity injected transistor is usually below $10_{18}$ $cm^{-3}$ in order to control the threshold voltage of the, the impurity atoms less than 10 are distributed at the channel region of the transistor in case that boron, arsenic or phosphorus is injected.

Therefore, the impurity for controlling the threshold voltage of the transistor is distributed depending on its location. Fine variations in the concentration of the impurity generating at the channel region greatly affects the threshold voltage. Due to this, it is actually impossible to employ an impurity in order to control the threshold voltage in the transistor of about nanometers.

Meanwhile, there are other problems in case that the threshold voltage is difficult to control by implanting an impurity into the channel region. In order to manufacture a transistor having a nanometers size, it is required that the depth of a junction in source and drain regions be also formed to be very shallow. It was reported in recent researches that the junction depth of the source and drain is about 0.25 times than the gate length of the transistor. Therefore, the appropriate junction depth is about 12 nm, in case that the gate length is 50 nm. As well know in the art, however, the junction depth is likely to be very deep due to a low impurity concentration at the channel region, which increase the short channel effect of the transistor to degrade an electrical characteristic of the transistor. In order to solve this problem, a transistor having a nano meter size is fabricated on a silicon substrate of a SOI structure not a bulk structure. It was found that the short channel effect of the transistor can be reduced by making the thickness of the SOI substrate existing on a buried oxide (hereinafter called "BOX") very shallow, so that the junction of the source and drain regions are formed to be shallow, as shown in FIG. 1. As a method of controlling the threshold voltage at the channel region of the transistor using an impurity could not be applied to the above method, it is impossible to control an adequate threshold voltage and the characteristic of the leakage current is thus very degraded.

FIG. 1 is a cross-sectional view of a nano transistor for describing a method of manufacturing the nano transistor using a conventional SOI substrate.

As shown in FIG. 1, a silicon substrate 11, a BOX layer 12 and a silicon layer are sequentially stacked on a substrate. The silicon layer is then removed except for regions where a gate electrode, source and drain in a NMOS transistor region A and a PMOS transistor region B will be formed. In the above, as the BOX layer 12 is formed to have the thickness of about 100~300 nm, the silicon substrate 11 and the silicon layer arc electrically completely separated. A gate insulating film 13 and a conductive layer are sequentially formed on remaining silicon layer and are then patterned to form a gate electrode 14 of the NMOS transistor A and a gate electrode 15 of the PMOS transistor B, respectively. A source and drain electrode 16 of the NMOS transistor A and a source and drain electrode 17 of the PMOS transistor B remaining on the silicon layer are each formed by a given impurity ion implantation process. As the silicon substrate 11 and the silicon layer are electrically completely separated by the BOX layer 12 in the nano transistor manufactured as above, the channel region of the transistor becomes a floating state to which no voltage is not applied. Therefore, a kink effect cause generated unwanted operation. In addition, as the thickness of the BOX layer is thick, no voltage is applied to the silicon substrate 11.

SUMMARY OF THE INVENTION

The present invention is contrived to solve the problems and an object of the present invention is therefore to provide a method of manufacturing a nano transistor capable of arbitrarily controlling the threshold voltage of a NMOS transistor and a PMOS transistor, in such as way that a voltage is applied to a SOI substrate not a conventional implantation of the impurity as it is impossible to control the threshold voltage by implanting the impurity into the channel region since the gate length of the transistor becomes below 50 nm.

In the present invention, as it is impossible to control the threshold voltage by controlling the concentration of an impurity in case that a device having a nanometers size is manufactured using a SOI substrate, a body effect is implemented using a silicon substrate existing below a BOX layer. Therefore, the threshold voltage of a NMOS transistor and a PMOS transistor can be adequately controlled as necessary.

In case that the SOI layer is completely depleted since the thickness of the SOI substrate is very thin, the threshold voltage of the transistor can be represented as follow using the depletion approximation.

$$V_{th}=V_{th0}-\gamma(V_{bb}-V_{ba}) \qquad \text{[Equation 1]}$$

$$V_{th0}=V_{fb}+(1+C_{si}/C_{ox})2\phi_F-0.5\times_q N_S/^{Cox} \qquad \text{[Equation 2]}$$

where, $V_{th}$ is the threshold voltage of a transistor formed on a SOI layer that is completely depleted, $V_{bb}$ is a voltage applied to a silicon substrate, $V_{ba}$ is a characteristic constant value determined by manufacturing characteristics of a device, $V_{fb}$ is a planarization voltage, $\phi_F$ is the Fermi energy level, $N_S$ is the impurity concentration of a channel region, $C_{Si}$ is the capacitance of the SOI layer, $C_{OX}$ is the capacitance of the gate insulating film and q is the charge amount of electrons. Also, $\gamma$ indicates a value defined as a body factor and can be represented as the following equation, which represents variations against the voltage applied to the silicon substrate of the threshold voltage $$\gamma=dV_{th}/dV_{bb} \qquad \text{[Equation 3]}$$

The body factor can be finally represented as below [Equation ] by means of approximation of ɣ.

ɣ=the thickness of the gate insulating film/the thickness of the BOX layer    [Equation 4]

As can be seen from [Equation 4], therefore, the threshold of the voltage transistor formed on the SOI substrate can be controlled by a voltage applied to the substrate, by adequately controlling the thickness of the BOX layer. In the SOI substrate employed usually, the thickness of the gate insulating film is about 3 nm and the thickness of the BOX layer is about 100~300 nm, in a nanometers region. In this case, as the body factor approaches to nearly 0, the voltage of the substrate rarely affects the threshold voltage. If the thickness of the BOX layer is controlled to have about 30 nm, however, the value of the body factor is almost about 0.1. Also, if the substrate is applied with a voltage of about 1V, an actual threshold voltage is increased by about 0.1V or reduced. Therefore, if a desired threshold voltage is to be formed, it is required that the thickness of the BOX layer and the voltage of the substrate be adequately controlled.

Further, in order to simultaneously control the threshold voltages of the NMOS transistor and the PMOS transistor, it is required that the voltages of the substrate be differently controlled. This can be easily accomplished by forming a well in the silicon substrate by means of a conventional high-energy ion implantation method. In other words, if a P type well is formed at a region where the NMOS transistor is formed and an N type well is formed at a region where the PMOS transistor is formed, different substrate voltages can be applied to different devices. As the N and P type wells include the entire transistor region, it could be seen that the size of the well is very great even in the nano transistor. Thus, there will be no any difficulty in manufacturing the device.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The threshold voltage of the transistor is conventionally controlled using the impurity concentration of the channel region. As the length of the gate in the transistor is gradually reduced to a nano size, however, it becomes difficult to control the threshold voltage using the concentration of the impurity. Particularly, the threshold voltage is also closely varied depending on variations of the location in the impurity concentration. Further, in case of using SOI, as the thickness of silicon on an upper layer is reduced to several tens of nanometers, it is also difficult to control implantation of the impurity into the channel region. The present invention therefore proposes a method of not only controlling the threshold voltage by implanting an impurity but also controlling the threshold voltages of the NMOS transistor and the PMOS transistor using the body effect by applying a voltage to an underlying silicon substrate layer.

In order to accomplish the above object, a method of manufacturing a nano transistor according to the present invention is characterized in that it comprises the steps of performing a first impurity ion implantation process for given regions on a SOI substrate in which a silicon substrate, a buried oxide film and a silicon layer are stacked to form a fist well at a given region on the silicon substrate; performing a second impurity ion implantation for other given regions on the SOI substrate to form a second well at other regions on the silicon substrate; removing the given regions of the silicon layer and then forming first and second gate electrodes in which a gate insulating film and a conductive layer are stacked at a given region on the remaining silicon layer; forming first and second source and drain at given regions on the remaining silicon layer; forming an insulating film on the entire structure and then etching a given region of the insulating film to form a first contact hole through which the first and second wells are exposed; etching a given region of the insulating film to form a second contact hole through which the first and second gate electrodes and the second source and drain are each exposed; and forming a metal layer so that the first and second contact holes are buried and then patterning the metal layer to form a metal wire.

The present invention will be described in detail by way of a preferred embodiment with reference to accompanying drawings.

FIG. 2a~FIG. 2e are cross-sectional views of nano transistors for describing a method of manufacturing the transistor using a SOI substrate according to the present invention.

Figure 1:
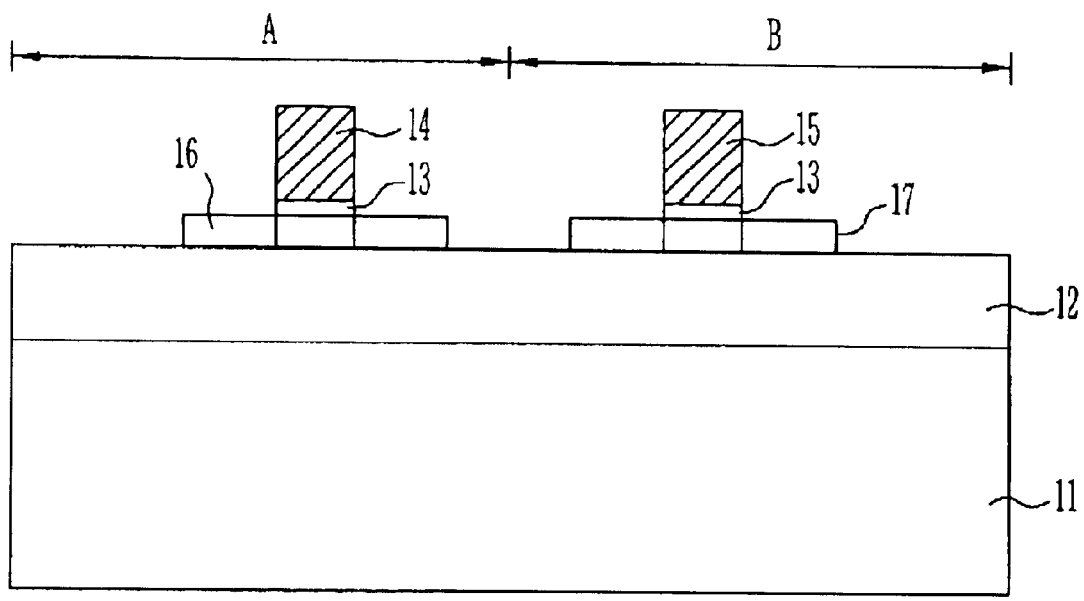
FIG. 1 is a schematic view of a nano transistor using a conventional SOI substrate.
Figure 2A:
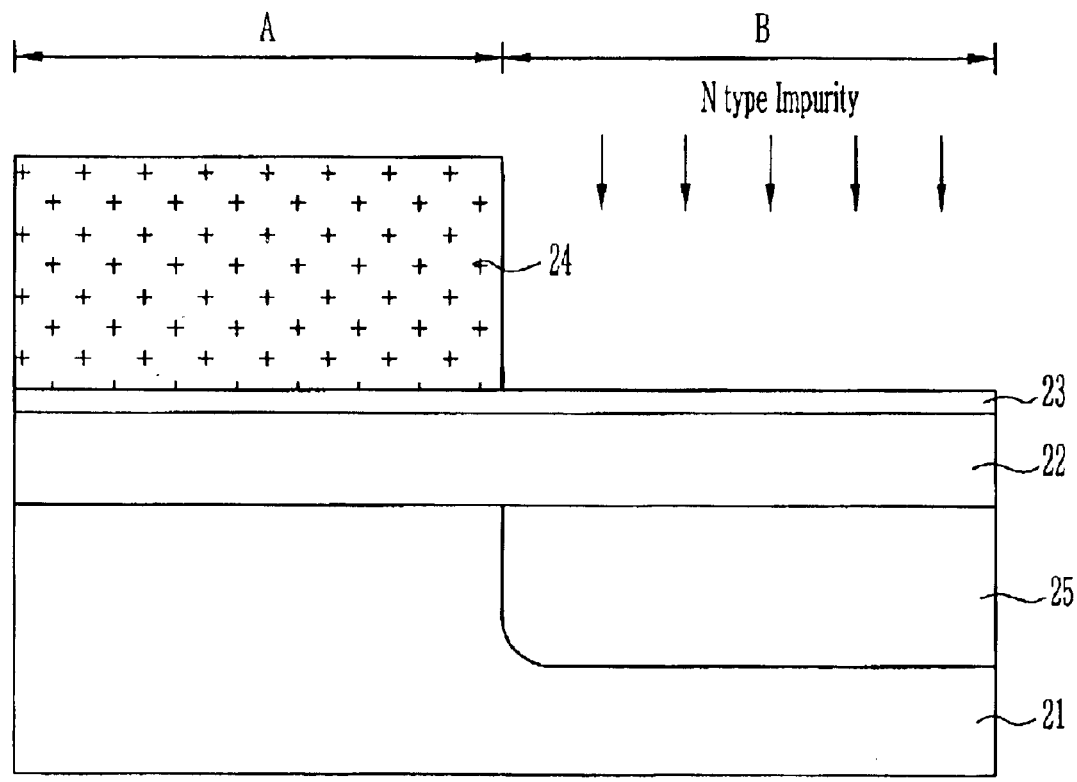
FIG. 2a~FIG. 2e are cross-sectional views of nano transistors for describing a method of manufacturing the transistor using a SOI substrate according to the present invention.

Referring first to FIG. 2a, a first photoresist pattern 24 is formed on a SOI substrate in which a silicon substrate 21, a BOX layer 22 and a silicon layer 23 are stacked. At this time, the BOX layer 22 is thinly formed in order to increase the body effect. It is preferred that the thickness of the BOX layer be about 10 times than that of a gate insulating film to be formed. The first photoresist pattern 24 is formed so that a NMOS transistor region (A) is closed and a PMOS transistor region (B) is exposed. Next, an N type impurity is implanted using a high-energy ion implantation method to form an N well 25 on the silicon substrate 21. A preferred high energy ion implantation condition for forming the N well 25 includes implanting phosphorus (P) ions 3 times with the ion implantation energy having about 1 MeV, 600 KeV and 200 KeV, respectively. It is also preferred that the amount of dose of the ion implantation is controlled so that an average concentration of the N well 25 is about $10^{17}$~$10^{18}$ $cm^{-3}$ after the ion implantation of three times and high temperature annealing process for recovering damaged lattices.

Figure 2B:
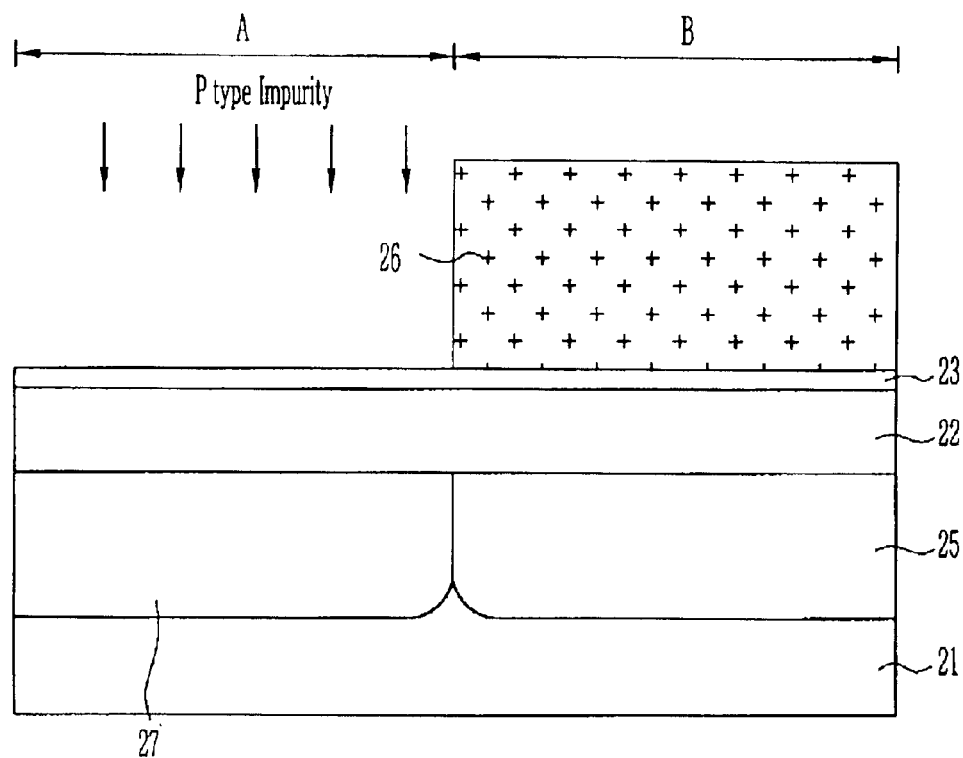

By reference to FIG. 2b, after the first photoresist pattern 24 is removed, a second photoresist pattern 26 is formed so that the NMOS transistor region (A) is opened and the PMOS transistor region (B) are exposed. A P type impurity is implanted by means of a high-energy ion implantation method to form a P well 27 on the silicon substrate 21. A preferred high-energy ion implantation condition for forming the P well 27 includes implanting boron (B) ions three times with the ion implantation energy having 600 KeV, 300 KeV and 100 KeV, respectively. It is also preferred that the dose amount upon the ion implantation is controlled so that an average concentration of the P well 27 is about $10^{17}$~$10^{18}$ $cm^{-3}$ after the ion implantation of three times and high temperature annealing process for recovering damaged lattices. After the N well 25 and the P well 27 are each formed by means of high energy ion implantation method, it is preferred that a high temperature annealing process is performed in order to activate the impurity and to recover damaged silicon layer 23.

Figure 2C:
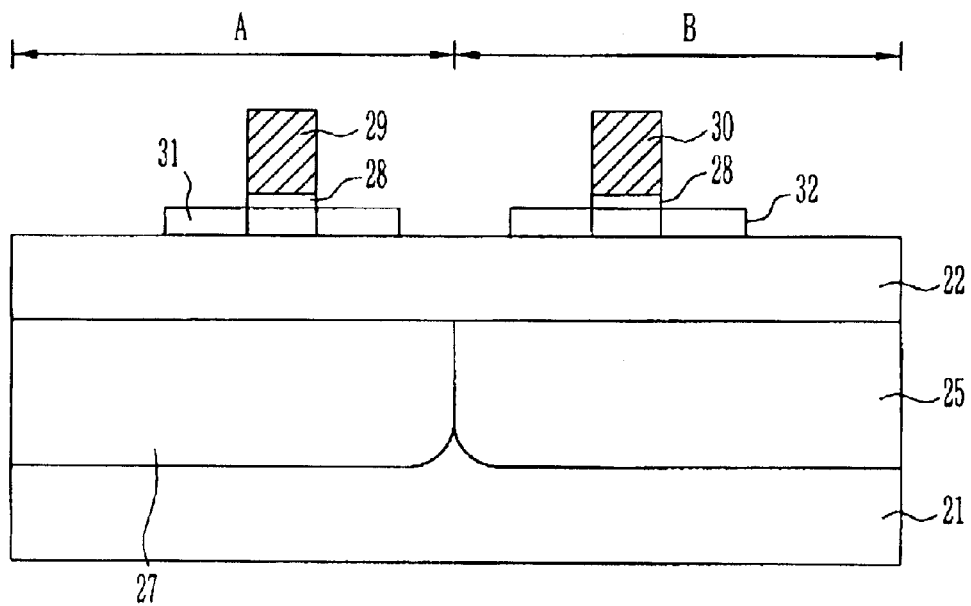

Referring to FIG. 2c, the silicon layer 23 is removed except for regions where a gate electrode, a source and a drain in the NMOS transistor region (A) and the PM.OS transistor region (B) will be formed. A gate insulating film 28 and a conductive layer are then sequentially formed on the silicon layer 23 and are then patterned to form a gate electrode 29 of the NMOS transistor (A) and a gate electrode 30 of the PMOS transistor (B), respectively. Thereafter, the ion implantation process is performed to form source and drain electrodes 31 of the NMOS transistor (A), and source and drain 32 of the PMOS transistor (B) at given regions of remaining silicon layer 23.

Figure 2D:
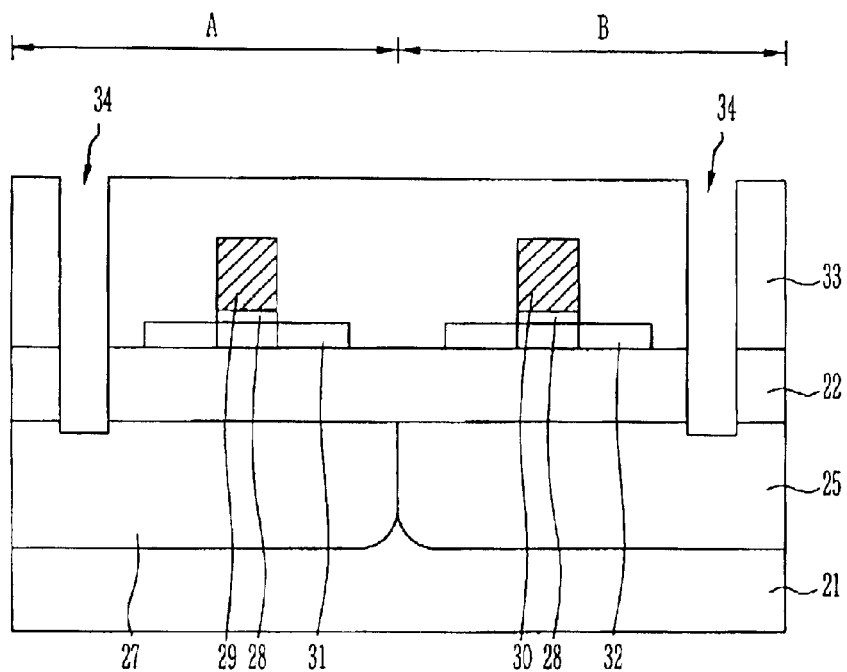

By reference to FIG. 2d, an insulating film 33 for insulating the device is formed on the entire structure. A given region of the insulating film 33 and underlying BOX layer 22 are etched to form contact holes 34 through which the N well 25 and the P well 27 are each exposed. In most cases, as the silicon layer 23 is driven in a complete depletion state in the nanometers transistor, the thickness of the silicon layer 23 is below several tens of nanometers. As the process of forming the contact hole could not simultaneously perform the silicon layer 23 and the silicon substrate 21, therefore, it is preferred that the process is separately performed. Meanwhile, the contact hole 34 is formed by anisotropy dry etching process.

Figure 2E:
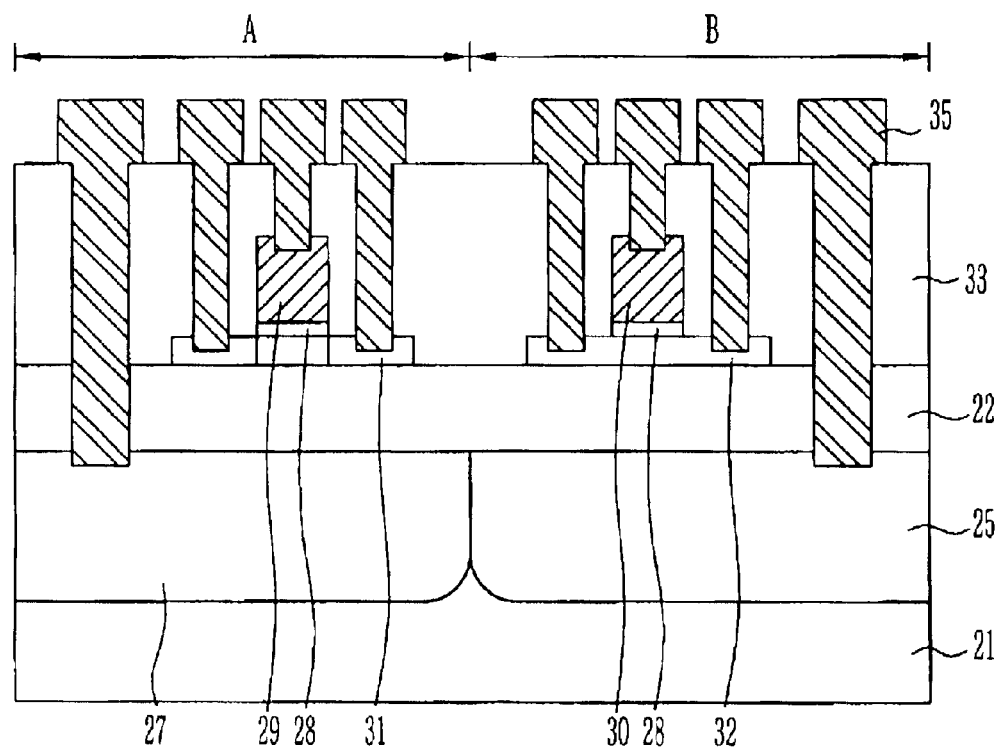

Referring to FIG. 2e, after the contact holes 34 through which the N well 25 and the P well 27 are exposed is formed, contact holes through which the gate electrodes 29 and 30 of the NMOS transistor (A) and the PMOS transistor (B), and the source and drain 31 and 32 are exposed are formed by the anisotropy dry etching process. Next, a metal layer is formed on the entire structure so that the contact holes can be buried and is then patterned to form a metal wire 35. As can be seen from the drawing, as a voltage is applied to the N well 25 and the P well 27 using metal wires 35, the threshold voltage of the nano transistor can be easily controlled with not implantation of the impurity. In other words, in case that the threshold voltage of the transistor is controlled, it is required that a voltage applied to the N well 25 is relatively higher than those to the P well 27. Thus, a reverse voltage is applied to a diode formed between the wells to prohibit the leakage current that may generate between the N well 25 and the P well 27 formed in the silicon substrate 21.

As mentioned above, the present invention can manufacture a nanometers transistor formed on a SOI substrate using a conventional method intact. Further, according to the present invention, given substrate voltages can be individually applied to a NMOS transistor and a PMOS transistor, respectively by forming an N well and a P well at given regions of an underlying silicon substrate. Therefore, the present invention has outstanding effects that it can control the threshold voltage to prevent an increase of the leakage current and thus implement a low-power device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a nano transistor, comprising the steps of:
    performing a first impurity ion implantation process for given regions on a SOI substrate in which a silicon substrate, a buried oxide film and a silicon layer are stacked to form a first well at a given region on the silicon substrate;
    performing a second impurity ion implantation for other given regions on the SOI substrate to form a second well at other regions on the silicon substrate;
    removing the given regions of the silicon layer and then forming first and second gate electrodes in which a gate insulating film and a conductive layer are stacked at a given region on the remaining silicon layer;
    forming first and second source and drain at given regions on the remaining silicon layer;
    forming an insulating film on the entire structure and then etching a given region of the insulating film to form a first contact hole through which the first and second wells are exposed;
    etching a given region of the insulating film to form a second contact hole through which the first and second gate electrodes and the second source and drain are each exposed; and
    forming a metal layer so that the first and second contact holes are buried and then patterning the metal layer to form a metal wire.

2. The method as claimed in claim 1, wherein said buried oxide film has a thickness equals to about ten times the thickness of the insulating film.

3. The method as claimed in claim 1, wherein said first well is formed by implanting phosphorous three times with the ion implantation energy having 1 MeV, 600 KeV and 200 KeV, respectively, and wherein the amount of dose of the ion implantation is controlled so that an average concentration of the first well becomes about $10^{17}$~$10^{18}$ cm$^{-3}$ after the ion implantation of three times and high temperature annealing process for recovering damaged lattices.

4. The method as claimed in claim 1, wherein said second well is formed by implanting boron three times with the ion implantation energy having 600 KeV, 300 KeV and 100 KeV, respectively, and wherein the amount of dose of the ion implantation is controlled so that an average concentration of the first well becomes about $10^{17}$~$10^{18}$ cm$^{-3}$ after the ion implantation of three times and high temperature annealing process for recovering damaged lattices.

5. The method as claimed in claim 1, wherein after the first and second wells are formed, a high-temperature annealing process is performed.

6. The method as claimed in claim 1, wherein said first and second contact holes are formed by anisotropy dry etching process.

7. The method as claimed in claim 1, wherein a voltage applied to the first well is relatively higher than a voltage applied to the second well.

8. The method as claimed in claim 1, wherein the first well is formed by implanting a N type impurity by means of a high-energy ion implantation process.

9. The method as claimed in claim 8, wherein said first well is formed by implanting phosphorous three times with the ion implantation energy having 1 MeV, 600 KeV and 200 KeV, respectively, and wherein the amount of dose of the ion implantation is controlled so that an average concentration of the first well becomes about $10^{17}$~$10^{18}$ cm$^{-3}$ after the ion implantation of three times and high temperature annealing process for recovering damaged lattices.

10. The method as claimed in claim 1, wherein said second well is formed by implanting a P type impurity by means of a high-energy ion implantation method.

11. The method as claimed in claim 10, wherein said second well is formed by implanting boron three times with the implantation energy having 600 KeV, 300 KeV and 100 KeV, respectively, and wherein the dose amount upon the implantation is controlled so that an average concentration of the second well becomes about $10^{17}$~$10^{18}$ cm$^{-3}$ after the ion implantation of three times and high temperature annealing process for recovering damaged lattices.

* * * * *